US009755184B2

United States Patent
Park et al.

(10) Patent No.: US 9,755,184 B2
(45) Date of Patent: Sep. 5, 2017

(54) DISPLAY PANEL AND METHOD OF FABRICATING THE SAME

(71) Applicant: Samsung Display Co., Ltd., Yongin-si, Gyeonggi-do (KR)

(72) Inventors: Bo Ik Park, Yongin-si (KR); Sun Ho Kim, Yongin-si (KR); Tae Woong Kim, Yongin-si (KR); Pil Suk Lee, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/995,021

(22) Filed: Jan. 13, 2016

(65) Prior Publication Data

US 2016/0293885 A1 Oct. 6, 2016

(30) Foreign Application Priority Data

Apr. 3, 2015 (KR) .................. 10-2015-0047669

(51) Int. Cl.
*H01L 21/00* (2006.01)
*H01L 51/52* (2006.01)
*H01L 27/32* (2006.01)
*H01L 51/56* (2006.01)
*H01L 51/00* (2006.01)

(52) U.S. Cl.
CPC ...... *H01L 51/5253* (2013.01); *H01L 27/3248* (2013.01); *H01L 51/524* (2013.01); *H01L 51/56* (2013.01); *H01L 27/3258* (2013.01); *H01L 51/0097* (2013.01); *H01L 2227/323* (2013.01); *H01L 2227/326* (2013.01); *H01L 2251/301* (2013.01); *H01L 2251/5338* (2013.01)

(58) Field of Classification Search
CPC .... H01L 51/524; H01L 51/56; H01L 51/5253
See application file for complete search history.

(56) References Cited

U.S. PATENT DOCUMENTS

| | | | |
|---|---|---|---|
| 8,832,929 B2 | 9/2014 | Lee et al. | |
| 2011/0101364 A1* | 5/2011 | Prabhakar | H01L 21/0237 257/66 |
| 2012/0212433 A1 | 8/2012 | Lee et al. | |
| 2013/0169515 A1 | 7/2013 | Prushinskiy et al. | |
| 2014/0218630 A1 | 8/2014 | Kang | |

FOREIGN PATENT DOCUMENTS

| | | |
|---|---|---|
| KR | 10-2009-0065803 | 6/2009 |
| KR | 10-2011-0106539 | 9/2011 |
| KR | 10-2012-0095019 | 8/2012 |
| KR | 10-2013-0076402 | 7/2013 |
| KR | 10-2014-0100090 | 8/2014 |

* cited by examiner

*Primary Examiner* — Douglas Menz
(74) *Attorney, Agent, or Firm* — Knobbe Martens Olson & Bear LLP

(57) ABSTRACT

A display panel includes a thin film transistor substrate and a display layer disposed on the thin film transistor substrate and having a display. The thin film transistor substrate may include a base substrate, a stress relief layer disposed on the base substrate and including at least one stress relief pattern, and a driver layer disposed on the stress relief layer and including at least one thin film transistor coupled to the display.

19 Claims, 6 Drawing Sheets

DISPLAY PANEL AND METHOD OF FABRICATING THE SAME

CROSS-REFERENCE TO RELATED APPLICATION

This application claims priority to, and the benefit of, Korean Patent Application No. 10-2015-0047669, filed on Apr. 3, 2015, in the Korean Intellectual Property Office, the entire content of which is incorporated herein by reference in its entirety.

BACKGROUND

Field

Embodiments relate to a display panel and a method of fabricating the same.

Description of the Related Technology

With development of information-oriented society, various display panels such as, for example, OLED panel, LCD panel, EPD panel and electro wetting display (EWD) panel are applied in display devices.

In recent years, a display device with light weight, thin film, capable of being mobile, flexible and foldable has been developed. The display panel for the display device may use a flexible substrate such as for example plastic, instead of glass substrate. However, the lifespan of the display panel may be reduced due to repetitive bending or rolling of the structure of the substrate.

SUMMARY OF CERTAIN INVENTIVE ASPECTS

An object is to provide a display panel capable of preventing reduction in life of display panel due to repeated bending or rolling.

Another object is to provide a method for manufacturing the display panel.

Embodiments may be realized by a display panel including a thin film transistor substrate and a display layer disposed on the thin film transistor substrate and having a display. The thin film transistor substrate may include a base substrate, a stress relief layer disposed on the base substrate and including at least one stress relief pattern, and a driver layer disposed on the stress relief layer and including at least one thin film transistor coupled to the display.

The stress relief layer may include a plurality of support patterns disposed spaced apart from each other and having a stripe shape, and the at least one stress relief pattern may be disposed between the support patterns.

A density of the at least one stress relief pattern may be lower than a density of the plurality of support patterns.

Each of the plurality of support patterns may include one of silicon oxide (SiOx), silicon nitride (SiNx), aluminum oxide (AlOx), aluminum nitride (AlNx) or molybdenum oxide (MoOx).

The display panel may further include a barrier layer disposed between the stress relief layer and the driver layer.

The stress relief pattern may be a cavity between the base substrate and the barrier layer.

The display panel may further include a barrier layer disposed between the base substrate and the stress relief layer and a buffer layer disposed between the stress relief layer and the driver layer.

The stress relief pattern may be a cavity between the barrier layer and the buffer layer.

The at least one stress relief pattern may be an empty space having a trench shape in which a part of the stress relief layer is removed.

The at least one stress relief layer may include a plurality of stress relief patterns with different depths.

The plurality of stress relief patterns have a structure filled with a material having a lower density than the stress relief layer.

The display panel may further include a sealing layer isolating the display device from an external environment.

The sealing layer may be an encapsulating substrate facing the thin film transistor substrate.

An embodiment of a method for manufacturing a display panel may include forming, on a base substrate, a stress relief layer including a plurality of support patterns and at least one stress relief pattern disposed between the support patterns, forming, on the stress relief layer, a driver layer including at least one thin film transistor, and forming, on the driver layer, a display layer including a display coupled to the thin film transistor. Forming the stress relief layer may include forming a support material layer on the base substrate and forming the support patterns by patterning the support material layer.

The at least one stress relief pattern may be a space between the support patterns.

The method may further include filling the at least one stress relief pattern with a material having a lower density than the support patterns.

The support material layer may include molybdenum oxide (MoOx).

Patterning the support material layer may include using a wet etch process with water as an etchant.

The method may further include forming a barrier layer disposed on the stress relief layer and the driver layer.

The at least one stress relief pattern may be a cavity between the base substrate and the barrier layer.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals generally refer to like elements throughout.

DETAILED DESCRIPTION OF CERTAIN INVENTIVE EMBODIMENTS

Figure 1:
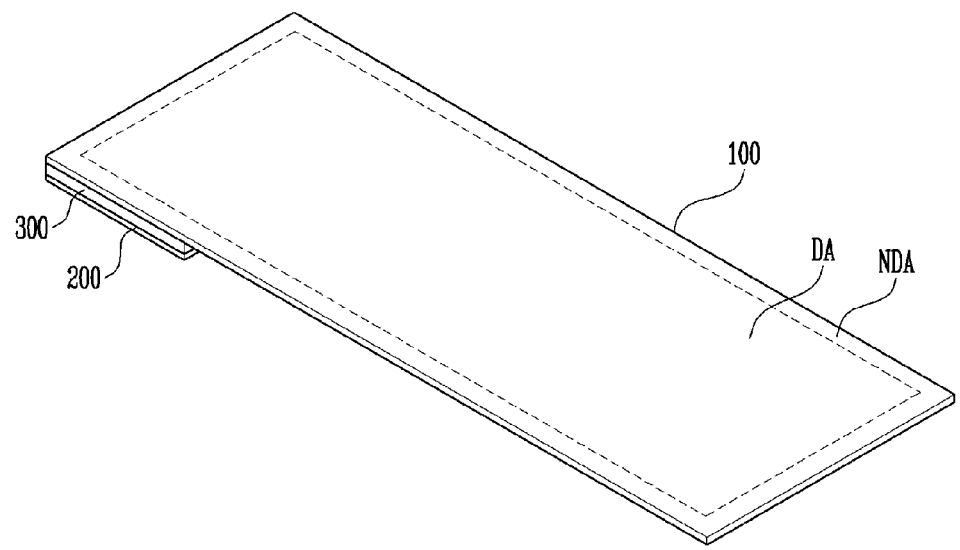
FIG. 1 is an exploded perspective view for illustrating a display device according to an embodiment.

In the following detailed description, only certain embodiments have been shown and described, simply by way of illustration. As those skilled in the art would realize, the described embodiments may be modified in various ways, without departing from the spirit or scope of the present invention. Accordingly, the drawings and description are to be regarded as illustrative in nature and not restrictive. In addition, it will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numbers generally refer to like elements throughout. As used herein, the term "and/or" includes any and all combinations of one or more of the associated listed items.

It will be understood that, although the terms first, second, and the like may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (for example rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
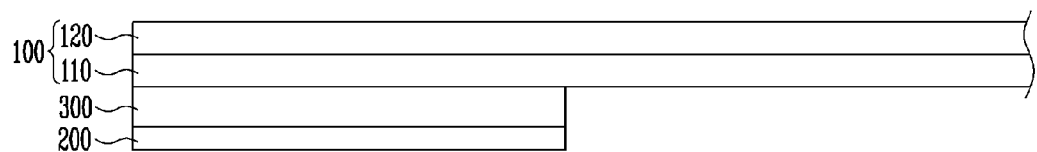
FIG. 2 is a cross-sectional view for illustrating the display device illustrated in FIG. 1.

FIG. 1 is an exploded perspective view for illustrating a display device according to an embodiment. FIG. 2 is a cross-sectional view for illustrating the display device illustrated in FIG. 1.

Referring to FIGS. 1 and 2, a display device may include a display panel 100, a housing 200 and a driving circuit part 300.

The display panel 100 may be flexible. The display panel 100 may be transparent. The display panel 100 may include a display area DA for displaying images and a non-display area NDA on a periphery of the display area DA.

However, the display panel 100 is not limited thereto. For example, but without limitation thereto, a self light emission type display panel such as an organic light emitting display (OLED) panel may be used as the display panel 100. In addition, a nonemissive display panel such as a liquid crystal display (LCD) panel, an electro-phoretic display (EPD) panel, and an electro-wetting display (EWD) panel may be used as the display panel 100. If a nonemissive display panel is used for the display panel 100, a mobile device employing the display panel may include a back-light unit for supplying light to the display panel 100. In an embodiment, the organic light emitting display (OLED) panel is described as an example of the display panel 100.

The display area DA may include a plurality of pixel areas. Lights emitted from the pixel areas may have different colors. For example, but without limitation thereto, a light emitted from the pixel areas may have one of the following colors: red; green; blue; cyan; magenta; or yellow.

The display panel 100 may include a thin film transistor substrate 110, a display device (not shown) disposed on the thin film transistor substrate 110 and a sealing layer 120 that separates the display device from an external environment. The display devices may be disposed in each of the pixel areas.

In each of the pixel areas, the thin film transistor substrate 110 may include a base substrate (not shown) and at least one thin film transistor (not shown) disposed on the base substrate.

The display device may be an organic light emitting device. For example, but without limitation thereto, the display device may include a first electrode coupling to the thin film transistor, an organic layer disposed on the first electrode and a second electrode disposed on the organic layer. One of the first electrode and the second electrode may be an anode electrode, and the other may be a cathode electrode. At least one of the first electrode and the second electrode may be a transmissive electrode. For example, but without limitation thereto, if the display device is an organic light emitting device of a bottom emission type, the first electrode may be a transmissive electrode, and the second electrode may be a reflective electrode. If the display device is an organic light emitting device of a top emission type, the first electrode may be a reflective electrode, and the second electrode may be a transmissive electrode. If the display device is an organic light emitting device of both top and bottom emission type, the first electrode and the second electrode may both be transmissive electrodes.

The organic layer may include at least an emitting layer (EML). Generally, the organic layer may have a multi-layered thin film structure. The color of the light from the emitting layer may be one of red, green, blue or white. However, it is not limited thereto. For example, but without limitation thereto, the color of the light from the emitting layer may be one of magenta, cyan, or yellow, for example.

The sealing layer 120 may isolate the display device from the external environment. The sealing layer 120 may be an encapsulating substrate facing the thin film transistor substrate 110. The sealing layer 120 may, through a sealant, be attached to the thin film transistor substrate 110. The sealant may be disposed in the non-display area NDA.

The housing 200 may include a material having an elastic or flexible property. The housing 200 may accommodate at least a part of the display panel 100 and the driving circuit part 300.

The driving circuit part 300 may be disposed under the display panel 100. The driving circuit part 300 may include a driving IC (not shown), a coupling film (not shown) and a circuit board (not shown).

The driving IC may include a gate driving IC and a data driving IC for a driving chip for driving the display panel 100.

The coupling film may include a plurality of wires formed on a film-typed substrate. The coupling film may mount the driving IC with a tape carrier package (TCP) or a chip on film (COF) to be electrically coupled to the thin film transistor substrate 110.

The circuit board may be electrically coupled to the thin film transistor substrate 110 via the coupling film and may supply a gate signal and a data signal to the thin film transistor substrate 110. The circuit board may be a printed circuit board (CPB) or a flexible printed circuit board (FPCB). Various electronic devices including a power unit and a controller may be mounted on the circuit board.

Hereinafter, the display panel 100 is described in further detail.

Figure 3:
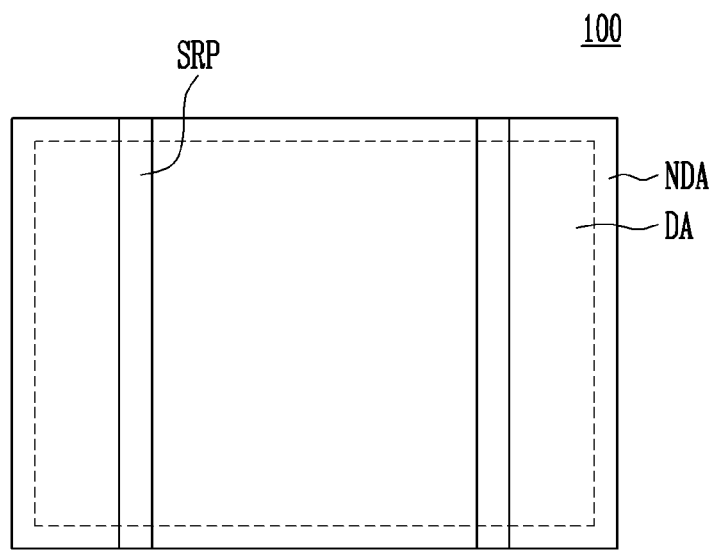
FIG. 3 is a planar view for illustrating the display panel illustrated in FIG. 1.
Figure 4:
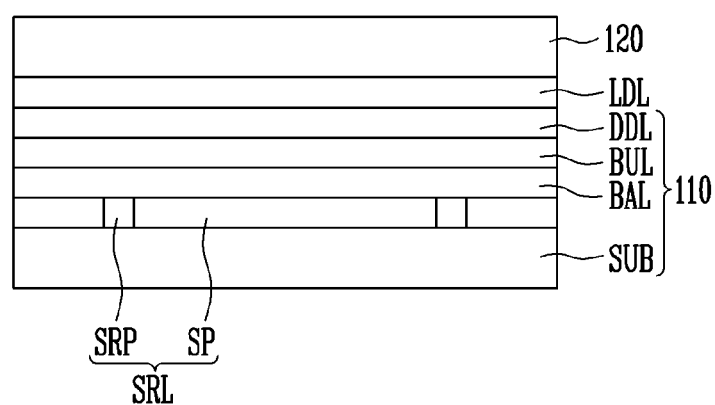
FIG. 4 is a cross-sectional view of the display panel shown in FIG. 3.
Figure 5:
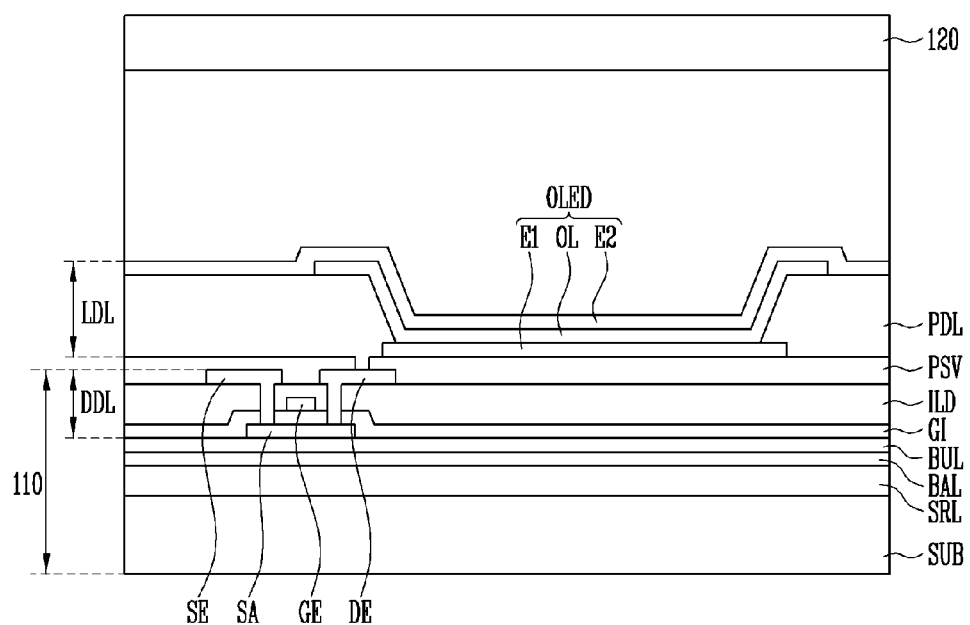
FIG. 5 is a cross-sectional view for illustrating a pixel of the display panel shown in FIG. 1.

FIG. 3 is a planar view for illustrating the display panel illustrated in FIG. 1. FIG. 4 is a cross-sectional view of the display panel shown in FIG. 3. FIG. 5 is a cross-sectional view for illustrating a pixel of the display panel shown in FIG. 1.

Referring to FIGS. 3 to 5, the display panel 100 may include a thin film transistor substrate 110, a display device layer LDL disposed on the thin film transistor substrate 110 and a sealing layer 120 isolating the display device layer LDL from an external environment.

The thin film transistor substrate 110 may include a base substrate SUB, a stress relief layer SRL disposed on the base substrate SUB and a driving device layer DDL disposed on the stress relief layer SRL.

The base substrate SUB may be a base substrate of flexible type. The base substrate SUB may be one of film base substrate and plastic base substrate including high molecular organic matters. For example, but without limitation thereto, the base substrate SUB may include one of polyethersulfone (PES), polyacrylate, polyetherimide (PEI), polyethyelenen naphthalate (PEN), polyethylene terephthalate (PET), polyphenylene sulfide (PPS), polyarylate (PAR), polyimide (PI), polycarbonate (PC), cellulose triacetate (TAC) or cellulose acetate propionate (CAP). The base substrate SUB may include fiber glass reinforced plastic (FRP).

A material applied to the base substrate SUB may have resistance (thermal resistance) to high processing temperature during a process of manufacturing the display panel 100.

The stress relief layer SRL may be disposed on the base substrate SUB and may prevent stress from being concentrated on a certain location inside the display panel 100 as the display panel 100 is bent or folded.

The stress relief layer SRL may include a plurality of support patterns SP spaced apart from each other and at least one stress relief pattern SRP disposed between the support patterns SP.

The support patterns SP may support the driving device layer DDL disposed on an upper portion of the stress relief layer SRL. The support patterns SP may include an insulating material by which patterning is made easy. For example, but without limitation thereto, the support patterns SP may include one of silicon oxide (SiOx), silicon nitride (SiNx), aluminum oxide (AlOx), aluminum nitride (AlNx) or molybdenum oxide (MoOx). The molybdenum oxide (MoOx) may be etched with water, and therefore, the support patterns SP may be easily formed.

The stress relief pattern SRP may alleviate stress occurring due to the bending of the display panel 100. The stress relief pattern SRP may prevent the stress occurring due to the bending from being concentrated on a certain portion of the display panel 100.

A density of the stress relief pattern SRP may be lower than the support patterns SP. For example, but without limitation thereto, the stress relief pattern SRP may be disposed between the support patterns SP and may be an empty space in a stripe shape extended in one direction.

From where the stress relief pattern is located, the display panel 100 may be easily bent. The stress relief pattern SRP may be a reference point for the display panel 100 to change. If the display panel 100 includes a plurality of the stress relief patterns SRP, the display panel 100 may be rolled.

A barrier layer BAL may be disposed between the stress relief layer SRL and the thin film transistor. The stress relief pattern SRP may be a cavity disposed between the base substrate SUB and the barrier layer BAL.

The barrier layer BAL may prevent penetration by moisture and oxygen into a semiconductor active layer SA of the thin film transistor. The barrier layer BAL may prevent impurities from spreading to the semiconductor active layer SA from the base substrate SUB. The barrier layer BAL may include at least one of silicon oxide (SiOx), silicon nitride (SiNx), silicon oxynitride (SiON), aluminum oxide (AlOx) or aluminum nitride (AlNx). The barrier layer BAL may flatten unevenness caused by the stress relief layer SRL.

A buffer layer BUL may be disposed between the barrier layer BAL and the thin film transistor. The buffer layer BUL may include a same material as the barrier layer BAL. The buffer layer BUL may flatten unevenness on a surface of the barrier layer BAL.

The driving device layer DDL may include at least one thin film transistor. The thin film transistor may include the semiconductor active layer SA, a gate electrode GE, a source electrode SE and a drain electrode DE.

The semiconductor active layer SA may be disposed on the buffer layer BUL. The semiconductor active layer SA may include one of amorphous silicon (a-Si), polycrystalline silicon (p-Si) or oxide semiconductor. An area in contact with the source electrode SE and the drain electrode DE in the semiconductor active layer SA may be a source area and a drain area into which impurities are doped or injected. An area between the source area and the drain area may be a channel area. The oxide semiconductor may include at least one of Zn, In, Ga, Sn or any mixture thereof. For example, but without limitation thereto, the oxide semiconductor may include indium-gallium-zinc oxide (IGZO).

Although not illustrated in the drawings, if the semiconductor active layer SA includes an oxide semiconductor, a light blocking layer may be disposed at an upper portion or a lower portion of the semiconductor active layer SA to block light flowing into the semiconductor active layer SA.

A gate insulating layer GI may be disposed on the semiconductor active layer SA. The gate insulating layer GI may cover the semiconductor active layer SA and insulate the semiconductor active layer SA and the gate electrode GE. The gate insulating layer GI may include a same material as the barrier layer BAL and the buffer layer BUL.

The gate electrode GE may be disposed on the gate insulating layer GI. The gate electrode GE may be disposed overlapping the semiconductor active layer SA. The gate electrode GE may include at least one of aluminum (Al), aluminum alloy (Al alloy), silver (Ag), tungsten (W), copper (Cu), nickel (Ni), chrome (Cr), molybdenum (Mo), titanium (Ti), platinum (Pt), tantalum (Ta), neodymium (Nd), scandium (Sc) or any alloy thereof.

An interlayer insulating layer ILD may be disposed on the gate electrode GE. The interlayer insulating layer ILD may insulate the gate electrode GE and the source electrode and the drain electrode DE. The interlayer insulating layer ILD may include a same material as the barrier layer BAL, the buffer layer BUL and the gate insulating layer GI.

The source electrode SE and the drain electrode DE may be disposed on the interlayer insulating layer ILD. The source electrode SE and the drain electrode DE may be insulated from the gate electrode GE due to the interlayer insulating layer ILD. The source electrode SE and the drain electrode DE may contact the source area and the drain area respectively.

In an embodiment, an example of the thin film transistor of a top gate structure is given. However, it should not be limited thereto. For example, but without limitation thereto, the thin film transistor may be a thin film transistor having a bottom gate structure.

A protective layer PSV may be disposed which covers the thin film transistor on the driving device layer DDL. A part of the protective layer PSV may be removed and expose a part of the drain electrode DE. The protective layer PSV may include at least one layer. For example, but without limitation thereto, the protective layer PSV may be an organic protective layer. The organic protective layer PSV may include one of acryl, polyimide (PI), polyamide (PA), or benzocyclobutene (BCB). The organic protective layer may be transparent and have fluidity and it may be a planarizing layer capable of flattening by alleviating a bend or a curve of a structure of a lower portion.

The protective layer PSV may include an inorganic protective layer (not shown) and an organic protective layer disposed on the inorganic protective layer. The inorganic protective layer may include a same material as the barrier layer BAL, the buffer layer BUL, the gate insulating layer GI and the interlayer insulating layer ILD.

The display device layer LDL may be disposed on the protective layer. The display device layer LDL may include a display device OLED coupling to the thin film transistor. The display device may be coupled to the drain electrode DE of the thin film transistor. The display device OLED may be an organic light emitting diode. Depending on the emission form, the display device OLED may be one of an organic light emitting device of a bottom emission type, an organic light emitting device of a top emission type or an organic light emitting device of both sided emission type. In an embodiment, an example of the display device OLED being an organic light emitting device of a bottom type is provided.

The display device OLED may include a first electrode E1 which is a transmissive electrode capable of allowing light to pass through, an organic layer OL disposed on the first electrode E1, and a second electrode E2 which is a reflective electrode disposed on the organic layer OL and capable of reflecting light.

The first electrode E1 may come in contact with the drain electrode DE. The first electrode E1 may be a conductive layer including a transparent conductive oxide of one of indium tin oxide (ITO), indium zinc oxide (IZO), aluminum zinc oxide (AZO), gallium doped zinc oxide (GZO), zinc tin oxide (ZTO), gallium tin oxide (GTO) or fluorine doped tin oxide (FTO).

A pixel defining layer PDL may be disposed on the first electrode E1. The pixel defining layer PDL may include an open area, and the open area may expose the first electrode E1.

The pixel defining layer PDL may include an organic insulating material. For example, but without limitation thereto, the pixel defining layer PDL may include at least one of polystyrene, poly(methyl methacrylate) (PMMA), polyacrylonitrile (PAN), polyamide, polyimide, polyarylether, heterocyclic polymer, parylene, fluorinated polymer, epoxy resin, benzocyclobutene series resin, siloxane series resin or silane resin.

An organic layer OL may be disposed on the first electrode E1 which is exposed by the pixel defining layer PDL. The organic layer OL may include at least an emitting layer EML and generally have a multi-layer thin film structure. For example, but without limitation thereto, the organic layer OL may include a hole injection layer HIL injecting holes, a hole transport layer HTL having superior transportation of holes and increasing an opportunity to re-couple holes and electrons by suppressing movement of electrons that were not coupled in the emitting layer EML, the emitting layer EML emitting light due to re-coupling of the injected electrons and holes, a hole blocking layer HBL suppressing movement of hoes that were not coupled in the emitting layer EML, an electron transport layer ETL smoothly transporting electrons to the emitting layer EML and an electron injection layer EIL injecting electrons. The color of the light generated from the emitting layer may be one of red, green, blue or white, but it is not limited thereto. For example, but without limitation thereto, the color of the light generated from the emitting layer of the organic layer OL may be one of magenta, cyan or yellow.

The second electrode E2 may be disposed on the organic layer OL. The second electrode E2 may include a material having a lower work function than the first electrode E1, for example, but without limitation thereto, at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca) or any alloy thereof. A conductive layer (not shown) for preventing IR-drop of the second electrode E2 may be further included on the second electrode E2.

The sealing layer 120 may be an encapsulating substrate facing the thin film transistor substrate 110. The sealing layer 120 may include a same material as the base substrate SUB. The sealing layer 120 may be a flexible substrate.

The sealing layer 120 may isolate the display device layer LDL, particularly the display device OLED from the external environment. The sealing layer 120 may be attached to the thin film transistor substrate 110 through a sealant. The sealant may be disposed in the non-display area NDA.

The sealing layer 120 may include a plurality of inorganic layers (not shown) and a plurality of organic layers (not shown) covering the display device OLED. The sealing layer may prevent penetration of moisture and oxygen into the display device OLED on the second electrode E2. The organic layer may include at least one of epoxy, polyimide, polyethylene terephthalate, polycarbonate, polyethylene or polyacrylate. The inorganic layer may include at least one of silicon oxide ($SiO_2$), silicon nitride (SiNx), aluminum oxide ($Al_2O_3$), titanium oxide ($TiO_2$), zirconium oxide (ZrOx) or zinc oxide (ZnO).

The display panel 100 may further include a filler filling a space between the thin film transistor substrate 110 and the sealing member 120. The filler may prevent damage to the display device OLED from an external impact.

Stress may be eased or ridden of due to bending or rolling by the stress relief pattern SRP in the display panel 100 as described above. The stress relief pattern SRP may prevent stress from being concentrated at one point even though the display panel 100 may be bent or rolled. The display panel 100 may prevent an inner crack from occurring due to bending or rolling. The display panel 100 may prevent the life from being reduced due to bending or rolling.

Referring to FIGS. 6 to 11, an embodiment of a method of manufacturing the display panel 100 is described.

FIGS. 6 to 11 illustrate a method of manufacturing the display panel shown in FIGS. 1 to 5.

Figure 6:
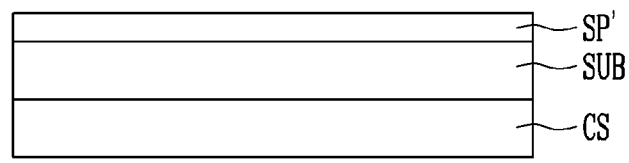
FIGS. 6 to 11 illustrate a method of manufacturing the display panel shown in FIGS. 1 to 5.

Referring to FIG. 6, a base substrate SUB may be formed on a carrier substrate CS.

The carrier substrate CS may be a glass substrate. The carrier substrate CS may be a substrate of rigid type. The carrier substrate CS may, in a subsequent process, support the base substrate SUB and prevent deformation of the base substrate SUB from occurring.

The base substrate SUB may be formed by coating high molecular organic matters on the carrier substrate CS. The high molecular organic matters may be one of polyethersulfone (PES), polyacrylate, polyetherimide (PEI), polyethyelenen naphthalate, polyethylene terephthalate (PET), polyphenylene sulfide (PPS), polyarylate (PAR), polyimide (PI), polycarbonate (PC), cellulose tri-acetate (TAC) or cellulose acetate propionate.

After the base substrate SUB is formed, an insulating material is applied on the base substrate SUB to form a support material layer SP'. The support material layer SP' may support a driving device layer DDL and a display device layer LDL to be subsequently formed.

The support material layer SP' may include an insulating material for smooth patterning. For example, but without limitation thereto, the support material layer SP' may include one of silicon oxide (SiOx), silicon nitride (SiNx), aluminum oxide (AlOx), aluminum nitride (AlNx) or molybdenum oxide (MoOx). In an embodiment, an example of the support material layer SP' including molybdenum oxide MoOx is provided.

Figure 7:
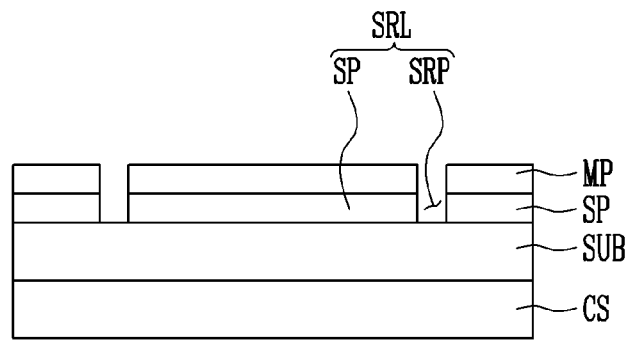

Referring to FIG. 7, after the support material layer SP' is formed, a mask pattern MP including at least one opening may be formed. The opening may expose a part of the support material layer SP'. The mask pattern MP may be formed by applying a photoregist material on the support material layer SP' and going through light exposure and development processes. The opening may have a shape extending in one direction.

A plurality of support patterns SP may be formed by patterning the support material layer SP' using the mask pattern MP. If the support material layer SP' includes the molybdenum oxide MoOX, patterning of the support material layer SP' may use a wet etching process with water as an etchant. This is because the molybdenum oxide (MoOx) is soluble in water.

A space between the support patterns SP may be a stress relief pattern SRP. A stress relief layer SRL including a plurality of support patterns SP and at least one stress relief pattern SRP disposed between the plurality of support patterns SP may be formed by the patterning.

The stress relief pattern SRP may have a shape corresponding to the opening. The stress relief pattern SRP may be an empty space having a stripe shape extending in one direction.

Although not shown in the drawings, after the stress relief layer SRL is formed, the stress relief pattern SRP may be filled with a material with lower density than that of the support patterns SP. The stress relief pattern SRP may be a pattern in which it is filled with a material with a lower density than that of the support patterns SP.

Figure 8:
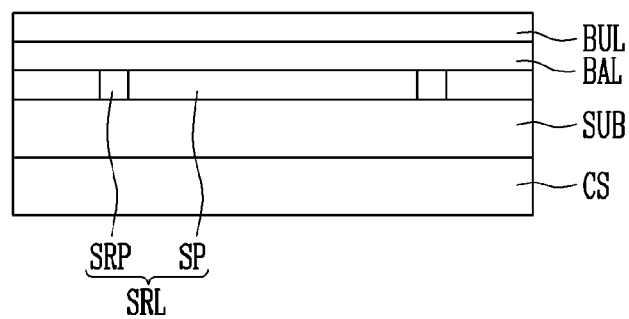

Referring to FIG. 8, after the stress relief layer SRL is formed, a barrier layer BAL may be formed on the stress relief layer SRL. The barrier layer BAL may flatten unevenness of a surface of the base substrate SUB generated by the stress relief layer SRL. The barrier layer BAL may include at least one of silicon oxide (SiOx), silicon nitride (SiNx), silicon oxy-nitride (SiON), aluminum oxide (AlOx) or aluminum nitride (AlNx).

After the barrier layer BAL is formed, a buffer layer BUL may be formed on the barrier layer BAL. The buffer layer BUL may include a same material as the barrier layer BAL. The buffer layer BUL may flatten unevenness of a surface of the barrier layer BAL.

Figure 9:
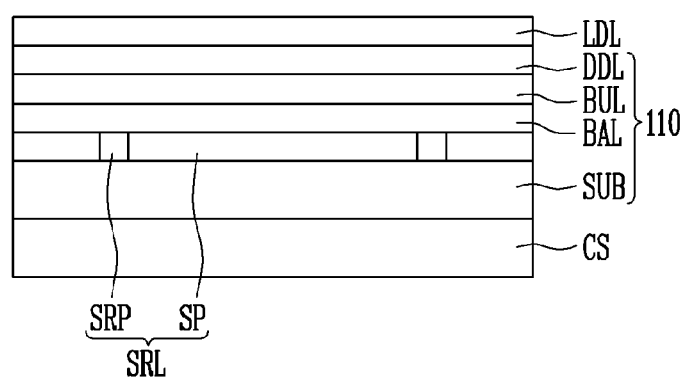

Referring to FIG. 9, after the buffer layer BUL is formed, a driving device layer DDL may be formed on the buffer layer BUL. The driving device layer DDL may include at least one thin film transistor. The thin film transistor may include a semiconductor active layer (SA), a gate electrode (GE), a source electrode (SE) and a drain electrode (DE).

The driving device layer DDL may be formed as follows.

The semiconductor active layer SA may be formed by applying a semiconductor material on the buffer layer BUL and patterning it. The semiconductor active layer SA may include one of amorphous silicon (a-Si), polycrystalline silicone (p-Si) or oxide semiconductor.

A gate insulating layer GI covering the semiconductor active layer SA may be formed. The gate insulating layer GI may cover the semiconductor active layer SA and insulate the semiconductor active layer SA and the gate electrode GE. The gate insulating layer GI may include at least one of silicon oxide (SiOx) or silicon nitride (SiNx).

After the gate insulating layer GI is formed, a conductive metal layer may be formed on the gate insulating layer GI and patterned to form the gate electrode GE. The gate electrode GE may be disposed overlapping the semiconductor active layer SA. The gate electrode GE may include at least one of aluminum (Al), aluminum alloy (Al alloy), silver (Ag), tungsten (W), copper (Cu), nickel (Ni), chrome (Cr), molybdenum (Mo), titanium (Ti), platinum (Pt), tantalum (Ta), neodymium (Nd), scandium (Sc) or any alloy thereof.

After the gate electrode GE is formed, an interlayer insulating layer ILD may be formed. The interlayer insulating layer ILD may insulate the gate electrode GE and the source electrode and the drain electrode DE. The interlayer insulating layer ILD may include a same material as the gate insulating layer GI.

After the interlayer insulating layer ILD is formed, a part of the semiconductor active layer SA may be exposed by patterning the interlayer insulating layer ILD. An area exposed from the semiconductor active layer SA may be an area coming into contact with the source electrode SE and the drain electrode DE which may be subsequently formed.

By forming a conductive layer on the interlayer insulating layer ILD and patterning it, by forming the source electrode SE and the drain electrode DE, a driving device layer DDL may be formed.

After the driving device layer DDL is formed, a protective layer PSV may be formed on the driving device layer DDL. The protective layer PSV may include at least one layer. For example, but without limitation thereto, the protective layer may be an organic protective layer. The organic protective layer may include one of acryl, polyimide (PI), polyamide (PA), or benzocyclobutene (BCB). The organic protective layer may be transparent and have fluidity and it may be a planarizing layer capable of flattening by alleviating a bend or a curve of a structure of a lower portion.

The protective layer PSV may include an inorganic protective layer (not shown) and an organic protective layer disposed on the inorganic protective layer. The inorganic protective layer may include a same material as the gate insulating layer GI and the interlayer insulating layer ILD.

After the protective layer PSV is formed, a part of the drain electrode DE may be exposed by patterning the protective layer PSV.

A display device layer LDL may be formed on the protective layer PSV. The display device layer LDL may include a display device OLED coupling to the drain electrode DE. The display device OLED may include a first electrode E1 which is a transmissive electrode capable of allowing light to pass through, an organic layer OL disposed on the first electrode E1, and a second electrode E2 which is a reflective electrode disposed on the organic layer OL and capable of reflecting light.

The display device layer LDL may be formed as follows.

A transparent conductive oxide layer may be formed on the protective layer PSV. The first electrode E1 may be formed by patterning the transparent conductive oxide layer. The first electrode E1 may come in contact with the drain electrode DE. The transparent conductive oxide layer may include one of indium tin oxide (ITO), indium zinc oxide (IZO), aluminum zinc oxide (AZO), gallium doped zinc oxide (GZO), zinc tin oxide (ZTO), gallium tin oxide (GTO) or fluorine doped tin oxide (FTO).

After the first electrode E1 is formed, a pixel defining layer PDL may be formed which exposes a part of the first electrode E1 on the first electrode E1. The pixel defining layer PDL may be formed by forming an organic insulating material layer to cover the first electrode E1 and patterning the organic insulating material layer. The pixel defining layer PDL may include at least one of polystylene, poly (methyl methacrylate) (PMMA), polyacrylonitrile (PAN), polyamide, polyimide, polyarylether, heterocyclic polymer, parylene, fluorinated polymer, epoxy resin, benzocyclobutene series resin, siloxane series resin or silane resin.

After the pixel defining layer PDL is formed, an organic layer OL may be formed on the first electrode E1 exposed by the pixel defining layer PDL. The organic layer OL may include at least an emitting layer EML and generally have a multi-layer thin film structure. For example, but without limitation thereto, the organic layer OL may be formed by sequentially stacking a hole injection layer HIL, a hole transport layer HTL, the emitting layer EML, a hole blocking layer HBL, an electron transport layer ETL and an electron injection layer EIL.

After the organic layer OL is formed, a second electrode E2 may be formed on the organic layer OL to form the display device layer LDL. A thin film transistor substrate 110 including the base substrate SUB, the stress relief layer SRL, the barrier layer BAL, the buffer layer BUL, the driving device layer DDL, the protective layer PSV and the display device layer LDL may thus be formed.

The second electrode E2 may have a work function that is lower than the first electrode E1. The second electrode E2 may include a material with superior reflectance. For example, but without limitation thereto, the second electrode E2 may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca) or any alloy thereof.

Although not illustrated in the drawings, after the second electrode E2 is formed, a conductive layer (not shown) for preventing IR-drop of the second electrode E2 may be formed on the second electrode E2.

Figure 10:
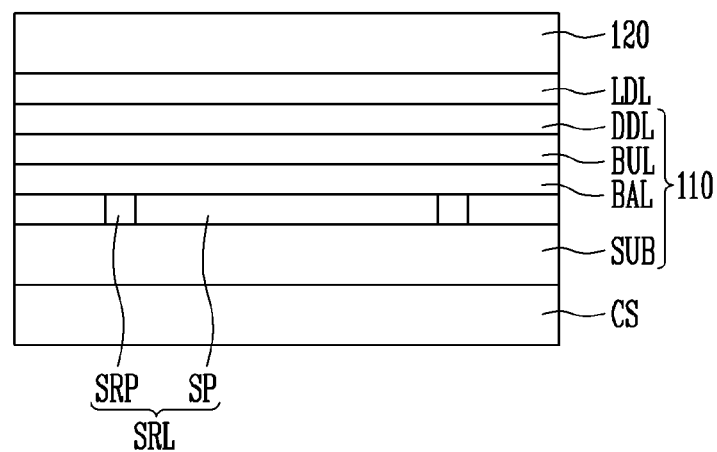

Referring to FIG. 10, after the display device layer LDL is formed, a sealing layer 120 isolating the display device OLED from the external environment may be formed. For example, but without limitation thereto, the sealing layer 120 may be an encapsulating substrate facing the thin film transistor substrate 110. The sealing layer 120 may include a same material as the base substrate SUB. The sealing layer 120 may be a flexible substrate.

If the sealing layer 120 is an encapsulating substrate, after the sealing layer 120 is disposed to face the thin film transistor substrate 110, the thin film transistor substrate 110 and the sealing layer 120 may be attached using a sealant (not shown).

Figure 11:
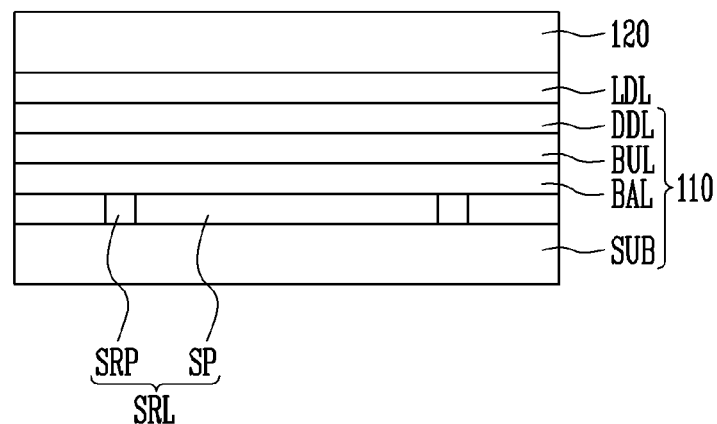

Referring to FIG. 11, after the sealing layer 120 is formed, the carrier substrate CS may be removed. For example, but without limitation thereto, the carrier substrate CS may be easily removed by applying heat from a surface of an opposite direction of a surface where the base substrate SUB is formed of the carrier substrate CS or irradiating a laser beam.

A method of manufacturing a display panel as described above may be easily performed through a process of etching the stress relief layer SRL. If the stress relief layer SRL includes the molybdenum oxide (MoOx), through a wet etching process using water as an etchant, the stress relief layer SRL may be formed. Therefore, a concern for environmental pollution according to an etch process may be reduced.

Hereinafter, referring to FIGS. 12 and 13, other embodiments are described. With respect to FIGS. 12 and 13, components same as the components shown in FIGS. 1 to 5 are given the same reference numerals, and description thereof will be omitted. To avoid repeated description in FIGS. 12 and 13, description of different features from FIGS. 1 to 5 will be provided.

Figure 12:
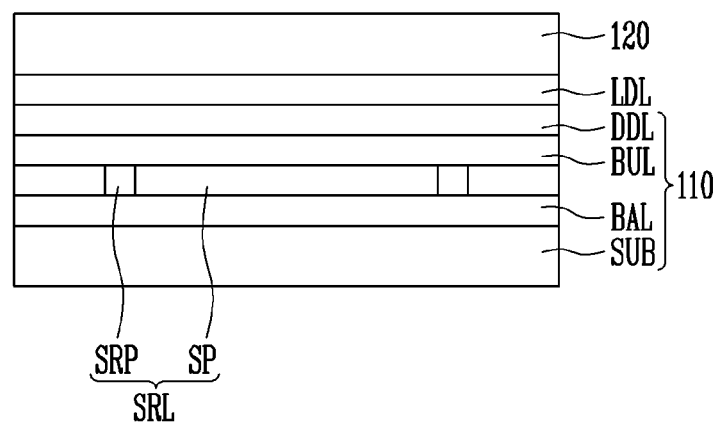
FIG. 12 is a cross-sectional view for illustrating a display panel according to another embodiment.

FIG. 12 is a cross-sectional view for illustrating a display panel according to another embodiment.

Referring to FIG. 12, a display panel 100 may include a thin film transistor substrate 110 and a sealing layer 120 facing the thin film transistor substrate 110.

The thin film transistor substrate 110 may include a base substrate SUB, a barrier layer BAL disposed on the base substrate SUB, a stress relief layer SRL disposed on the barrier layer BAL, a buffer layer BUL disposed on the stress relief layer SRL, a driving device layer DDL disposed on the buffer layer BUL and a display device layer LDL disposed on the driving device layer DDL.

The base substrate SUB may be a base substrate of flexible type.

The barrier layer BAL may include at least one of silicon oxide (SiOx), a silicon nitride (SiNx), a silicon oxynitride (SiON), aluminum oxide (AlOx) or aluminum nitride (AlNx). The barrier layer BAL may flatten a surface of the base substrate SUB.

The stress relief layer SRL may be disposed on the barrier layer BAL and prevent stress from being concentrated on a certain point inside the display panel 100 as the display panel 100 is bent or folded.

The stress relief layer SRL may include a plurality of support patterns SP and at least one stress relief pattern SRP disposed between the support patterns SP.

The support patterns SP may support the driving device layer DDL disposed on an upper portion of the stress relief layer SRL and the display device layer LDL.

A density of the stress relief pattern SRP may be lower than a density of the support patterns SP. For example, but without limitation thereto, the stress relief pattern SRP may be disposed between the support patterns SP and be an empty space having a stripe shape extending in one direction.

The stress relief pattern SRP may be disposed in a space between the support patterns SP and include a material with a density lower than that of the support patterns SP.

The buffer layer BUL may be disposed on the stress relief layer SRL and flatten unevenness generating due to the stress relief layer SRL. Therefore, the stress relief pattern SRP may be a cavity disposed between the barrier layer BAL and the buffer layer BUL.

The driving device layer DDL may include at least one thin film transistor. The thin film transistor may include the semiconductor active layer SA, a gate electrode GE, a source electrode Se and a drain electrode DE.

A protective layer PSV covering the thin film transistor may be disposed on the display device layer LDL.

The display device layer LDL may be disposed on the protective layer PSV. The display device layer LDL may include a display device OLED coupling to the thin film transistor. The display device may contact the drain electrode DE of the thin film transistor.

Figure 13:
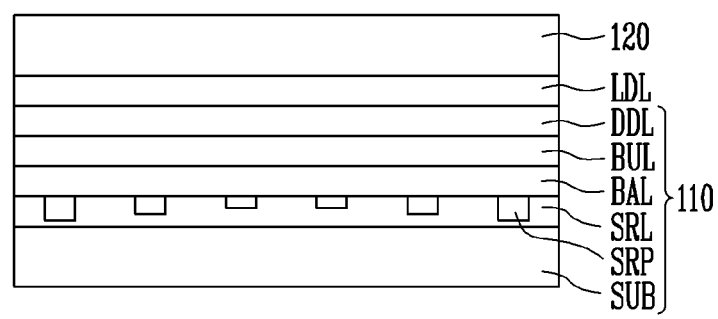
FIG. 13 is a cross-sectional view for illustrating a display panel according to yet another embodiment.

FIG. 13 is a cross-sectional view for illustrating a display panel according to yet another embodiment.

Referring to FIG. 13, a display panel 100 may include a thin film transistor substrate 110 and a sealing layer 120 facing the thin film transistor substrate 110.

The thin film transistor substrate 110 may include a base substrate SUB, a stress relief layer SRL disposed on the base substrate SUB, a driving device layer DDL disposed on the stress relief layer SRL and a display device layer LDL disposed on the driving device layer DDL.

The base substrate SUB may be a base substrate of flexible type.

The stress relief layer SRL may be disposed on the barrier layer BAL. The stress relief layer SRL may prevent stress from being concentrated in a certain location inside the display panel 100 as the display panel 100 is bent or folded. The stress relief layer SRL may include a plurality of stress relief patterns SRP having a stripe shape extending in one direction. The stress relief patterns SRP may be an empty space having a trench shape where a part of the stress relief layer SRL is removed. The stress relief patterns SRP may have different depths.

The stress relief patterns SRP may have a structure where a material with lower density than that of the stress relief layer SRL is filled.

A barrier layer BAL may be disposed on the stress relief layer SRL. A buffer layer BUL may be disposed on the barrier layer BAL. The barrier layer BAL may flatten unevenness generated due to the stress relief layer SRL.

The driving device layer DDL may be disposed on the buffer layer BUL and include at least one thin film transistor. The thin film transistor may include the semiconductor active layer SA, a gate electrode GE, a source electrode SE and a drain electrode DE.

A protective layer PSV covering the thin film transistor may be disposed on the display device layer LDL.

The display device layer LDL may be disposed on the protective layer PSV. The display device layer LDL may include a display device OLED coupled to the thin film transistor. The display device may come in contact with the drain electrode DE of the thin film transistor.

Example embodiments have been disclosed herein, and although specific terms are employed, they are used and are to be interpreted in a generic and descriptive sense only and not for purposes of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display panel comprising:
a thin film transistor substrate; and
a display layer disposed on the thin film transistor substrate and including a display,
wherein the thin film transistor substrate comprises:
a base substrate;
a stress relief layer disposed on the base substrate and including at least one stress relief pattern, wherein the stress relief layer includes a plurality of support patterns disposed spaced apart from each other and having a stripe shape, and wherein the at least one stress relief pattern is disposed between the support patterns; and
a driver layer disposed on the stress relief layer and including at least one thin film transistor coupled to the display.

2. The display panel of claim 1, wherein a density of the at least one stress relief pattern is lower than a density of the plurality of support patterns.

3. The display panel of claim 1, wherein each of the plurality of support patterns includes one of silicon oxide (SiOx), silicon nitride (SiNx), aluminum oxide (AlOx), aluminum nitride (AlNx), or molybdenum oxide (MoOx).

4. The display panel of claim 1, further comprising a barrier layer disposed between the stress relief layer and the driver layer.

5. The display panel of claim 4, wherein the at least one stress relief pattern is a cavity between the base substrate and the barrier layer.

6. The display panel of claim 1, further comprising:
a barrier layer disposed between the base substrate and the stress relief layer; and
a buffer layer disposed between the stress relief layer and the driver layer.

7. The display panel of claim 6, wherein the at least one stress relief pattern is a cavity between the barrier layer and the buffer layer.

8. The display panel of claim 1, further comprising a sealing layer isolating the display from an external environment.

9. The display panel of claim 8, wherein the sealing layer is an encapsulating substrate facing the thin film transistor substrate.

10. A method for manufacturing the display panel of claim 1, the method comprising:
forming, on the base substrate, the stress relief layer including a plurality of support patterns and the at least one stress relief pattern disposed between the support patterns;
forming, on the stress relief layer, the driver layer including the at least one thin film transistor; and
forming, on the driver layer, the display layer including the display coupled to the at least one thin film transistor,
wherein forming the stress relief layer comprises:
forming a support material layer on the base substrate; and
forming the support patterns by patterning the support material layer.

11. The method of claim 10, wherein the at least one stress relief pattern is a space between the support patterns.

12. The method of claim 11, further comprising filling the at least one stress relief pattern with a material having a lower density than the support patterns.

13. The method of claim 10, wherein the support material layer includes one of silicon oxide (SiOx), silicon nitride (SiNx), aluminum oxide (AlOx), aluminum nitride (AlNx), or molybdenum oxide (MoOx).

14. The method of claim 13, wherein the support material layer includes molybdenum oxide (MoOx), wherein patterning the support material layer includes using a wet etch process with water as an etchant.

15. The method of claim 11, further comprising forming a barrier layer disposed on the stress relief layer and the driver layer.

16. The method of claim 15, wherein the at least one stress relief pattern is a cavity between the base substrate and the barrier layer.

17. A display panel of comprising:
a thin film transistor substrate; and
a display layer disposed on the thin film transistor substrate and including a display,
wherein the thin film transistor substrate comprises:
a base substrate;
a stress relief layer disposed on the base substrate and including at least one stress relief pattern; and
a driver layer disposed on the stress relief layer and including at least one thin film transistor coupled to the display, and
wherein the at least one stress relief pattern is an empty space having a trench shape in which a part of the stress relief layer is removed.

18. The display panel of claim 17, wherein the stress relief layer includes a plurality of stress relief patterns with different depths.

19. The display panel of claim 17, wherein the plurality of stress relief patterns fill the empty space with a material having a lower density than the stress relief layer.

* * * * *